(12) United States Patent
Farris, III (10) Patent No.: US 8,772,078 B1
(45) Date of Patent: *Jul. 8, 2014

(54) METHOD AND SYSTEM FOR LASER SEPARATION FOR EXCLUSION REGION OF MULTI-JUNCTION PHOTOVOLTAIC MATERIALS

(75) Inventor: Chester A. Farris, III, Yorba Linda, CA (US)

(73) Assignee: Stion Corporation, San Jose, CA (US)

( * ) Notice: Subject to any disclaimer, the term of this patent is extended or adjusted under 35 U.S.C. 154(b) by 170 days.

This patent is subject to a terminal disclaimer.

(21) Appl. No.: 12/389,188

(22) Filed: Feb. 19, 2009

Related U.S. Application Data (60) Provisional application No. 61/033,405, filed on Mar. 3, 2008.

(51) Int. Cl.
*H01L 21/00* (2006.01)

(52) U.S. Cl.
USPC ............. 438/98; 438/15; 438/30; 257/461; 257/E21.415; 257/E21.113; 136/256

(58) Field of Classification Search
USPC ........... 438/15, 16, 17, 30, 52, 53, 54, 55, 56, 438/57, 98; 257/414, 431, 461, E21.415, 257/E27.111, E27.112, E31.052; 136/243, 136/253, 256
See application file for complete search history.

(56) References Cited

U.S. PATENT DOCUMENTS

| | | | |
|---|---|---|---|
| 3,828,722 A | 8/1974 | Reuter et al. | |
| 4,263,336 A | 4/1981 | Thompson et al. | |
| 4,335,266 A | 6/1982 | Mickelsen et al. | |
| 4,441,113 A | 4/1984 | Madan | |
| 4,461,922 A | 7/1984 | Gay et al. | |
| 4,465,575 A | 8/1984 | Love et al. | |
| 4,471,155 A | 9/1984 | Mohr et al. | |

(Continued)

FOREIGN PATENT DOCUMENTS

| | | |
|---|---|---|
| AU | 734676 | 2/1999 |
| DE | 3314197 A1 | 3/1983 |

(Continued)

OTHER PUBLICATIONS

Chopra et al., Thin-Film Solar Cells: An Overview, 2004, Progress in Photovoltaics: Research and Applications, 2004, vol. 12, pp. 69-92.

(Continued)

*Primary Examiner* — Su Kim
(74) *Attorney, Agent, or Firm* — Kilpatrick Townsend & Stockton LLP (57) ABSTRACT

A method for laser separation of a thin film structure with multi junction photovoltaic materials. The method includes providing an optically transparent substrate having a thickness, a back surface region, and a front surface region including an edge region. The method further includes forming a thin film structure including a conductive layer on the optical transparent substrate. The conductive layer immediately overlies the front surface region. Additionally, the method includes aligning a laser beam with a beam spot on a first portion of the edge region from the back surface region through the thickness of the optically transparent substrate. The method further includes subjecting at least partially the conductive layer overlying the first portion via absorbed energy from the laser beam to separate an edge portion of the thin film structure from the first portion of the edge region.

23 Claims, 9 Drawing Sheets

(56) References Cited

U.S. PATENT DOCUMENTS

| | | |
|---|---|---|
| 4,499,658 A | 2/1985 | Lewis |
| 4,507,181 A | 3/1985 | Nath et al. |
| 4,517,403 A | 5/1985 | Morel et al. |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,589,918 A | 5/1986 | Nishida |
| 4,598,306 A | 7/1986 | Nath et al. |
| 4,599,154 A | 7/1986 | Bender et al. |
| 4,611,091 A | 9/1986 | Choudary et al. |
| 4,612,411 A | 9/1986 | Wieting et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,724,011 A | 2/1988 | Turner et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,865,999 A | 9/1989 | Xi et al. |
| 4,914,042 A | 4/1990 | Mahan |
| 4,915,745 A | 4/1990 | Pollock et al. |
| 4,950,615 A | 8/1990 | Basol et al. |
| 4,996,108 A | 2/1991 | Divigalpitiya et al. |
| 5,008,062 A | 4/1991 | Anderson et al. |
| 5,028,274 A | 7/1991 | Basol et al. |
| 5,029,760 A | 7/1991 | Gamblin |
| 5,039,353 A | 8/1991 | Schmitt |
| 5,045,409 A | 9/1991 | Eberspacher et al. |
| 5,069,727 A | 12/1991 | Kouzuma et al. |
| 5,069,868 A | 12/1991 | Tokiai et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,180,686 A | 1/1993 | Banerjee et al. |
| 5,211,824 A | 5/1993 | Knapp |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,436,204 A | 7/1995 | Albin et al. |
| 5,474,939 A | 12/1995 | Pollock et al. |
| 5,501,744 A | 3/1996 | Albright et al. |
| 5,512,107 A | 4/1996 | Van den Berg |
| 5,536,333 A | 7/1996 | Foote et al. |
| 5,665,175 A | 9/1997 | Safir |
| 5,858,819 A | 1/1999 | Miyasaka |
| 5,977,476 A | 11/1999 | Guha et al. |
| 6,160,215 A | 12/2000 | Curtin |
| 6,166,319 A | 12/2000 | Matsuyama |
| 6,288,415 B1 | 9/2001 | Leong et al. |
| 6,294,274 B1 | 9/2001 | Kawazoe |
| 6,328,871 B1 | 12/2001 | Ding et al. |
| RE37,512 E | 1/2002 | Szlufcik et al. |
| 6,784,492 B1 | 8/2004 | Morishita et al. |
| 6,852,920 B2 | 2/2005 | Sager et al. |
| 6,872,635 B2* | 3/2005 | Hayashi et al. ............... 438/463 |
| 6,878,871 B2 | 4/2005 | Scher et al. |
| 6,881,984 B2* | 4/2005 | Takaoka ........................ 257/98 |
| 7,180,101 B2 | 2/2007 | Ouichi |
| 7,265,037 B2 | 9/2007 | Yang et al. |
| 7,855,089 B2* | 12/2010 | Farris et al. .................... 438/16 |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |

| | | |
|---|---|---|
| 2002/0063065 A1 | 5/2002 | Sonoda |
| 2002/0119592 A1* | 8/2002 | Oswald et al. ................ 438/96 |
| 2002/0125905 A1* | 9/2002 | Borden et al. ................ 324/765 |
| 2003/0075717 A1 | 4/2003 | Kondo et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0095658 A1 | 5/2004 | Buretea et al. |
| 2004/0110393 A1 | 6/2004 | Munzer et al. |
| 2004/0203220 A1 | 10/2004 | Morooka et al. |
| 2004/0244826 A1 | 12/2004 | Takagi |
| 2004/0245912 A1 | 12/2004 | Thurk et al. |
| 2004/0252488 A1 | 12/2004 | Thurk |
| 2005/0111727 A1* | 5/2005 | Emery ........................... 382/145 |
| 2005/0164432 A1 | 7/2005 | Lieber et al. |
| 2005/0212145 A1* | 9/2005 | Imoto et al. ................... 257/782 |
| 2005/0287717 A1 | 12/2005 | Heald et al. |
| 2006/0002838 A1 | 1/2006 | Oda |
| 2006/0003585 A1 | 1/2006 | Morooka |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0053969 A1 | 3/2006 | Harada |
| 2006/0096632 A1* | 5/2006 | Oswald ......................... 136/251 |
| 2006/0173113 A1 | 8/2006 | Yabuta et al. |
| 2006/0220059 A1 | 10/2006 | Satoh et al. |
| 2006/0266409 A1* | 11/2006 | Takeda et al. ................ 136/252 |
| 2007/0006914 A1 | 1/2007 | Lee |
| 2007/0089782 A1 | 4/2007 | Scheuten et al. |
| 2007/0151596 A1 | 7/2007 | Nasuno et al. |
| 2007/0169810 A1 | 7/2007 | Van Duern et al. |
| 2008/0029154 A1 | 2/2008 | Mishtein et al. |
| 2008/0041446 A1 | 2/2008 | Wu et al. |
| 2008/0092945 A1 | 4/2008 | Munteanu et al. |
| 2008/0092953 A1 | 4/2008 | Lee |
| 2008/0283389 A1 | 11/2008 | Aoki' |
| 2009/0058295 A1 | 3/2009 | Auday et al. |
| 2010/0258179 A1 | 10/2010 | Wieting |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0071659 A1 | 3/2011 | Farris, III et al. |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |

FOREIGN PATENT DOCUMENTS

| | | |
|---|---|---|
| DE | 10104726 A1 | 8/2002 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270521 | 9/2002 |
| JP | 2004/332043 | 11/2004 |
| JP | 2005/311292 | 11/2005 |
| WO | 2005011002 | 2/2005 |

OTHER PUBLICATIONS

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of ZnxCd1_xS Nanocomposites in Poly- (56) References Cited

OTHER PUBLICATIONS mer Matrices and their Photophysical Properties, Langmuir 1998, 14, pp. 4342-4344.

International Search Report and Written Opinion of PCT Application No. PCT/US08/76908, date of mailing Dec. 1, 2008, 8 pages total.

International Search Report and Written Opinion of PCT Application No. PCT/US2008/078001, date of mailing Dec. 2, 2008, 7 pages total.

International Search Report and Written Opinion of PCT Application No. PCT/US08/78019, date of mailing Dec. 8, 2008, 9 pages total.

International Search Report and Written Opinion of PCT Application No. PCT/US08/77965, date of mailing Dec. 9, 2008, 8 pages total.

International Search Report & Written Opinion of PCT Application No. PCT/US 09/46161, date of mailing Jul. 27, 2009, 14 pages total.

International Search Report & Written Opinion of PCT Application No. PCT/US 09/46802, mailed on Jul. 31, 2009, 11 pages total.

Onuma et al., Preparation and Characterization of CuInS Thin Films Solar Cells with Large Grain, Elsevier Science B.V; Solar Energy Materials & Solar Cells 69 (2001) pp. 261-269.

Yang et al., Fabrication and Characteristics of ZnS Nanocrystals/Polymer Composite Doped with Tetraphenylbenzidine Single Layer Structure Light-emitting Diode, Applied Physics Lett. vol. 69 (3), Jul. 15, 1996, pp. 377-379.

Yang et al., Preparation, Characterization and Electroluminescence of ZnS Nanocrystals in a Polymer Matrix, J. Mater. Chem., 1997, 7(1), pp. 131-133.

Yang et al., Electroluminescence from ZnS/CdS Nanocrystals/Polymer Composite, Synthetic Metals 91, (1997) 347-349.

Salvador, "Hole diffusion length in n-TiO2 single crystals and sintered electrodes: photoelectrochemical determination and comparative analysis," Journal of Applied Physics, vol. 55, No. 8, pp. 2977-2985, Apr. 15, 1984.

* cited by examiner

Top View of Back Surface Region

METHOD AND SYSTEM FOR LASER SEPARATION FOR EXCLUSION REGION OF MULTI-JUNCTION PHOTOVOLTAIC MATERIALS

CROSS-REFERENCES TO RELATED APPLICATIONS

This application claims priority to and benefit from U.S. Provisional Patent Application No. 61/033,405, filed Mar. 3, 2008 and commonly assigned, the disclosure of which is hereby incorporated herein by reference for all purposes.

BACKGROUND OF THE INVENTION

The present invention relates generally to laser separation of thin film materials. More particularly, the present invention provides a method and system for laser separation to selectively removing a portion of a thin film device. In particular, the method is applied for edge fabrication of a thin film photovoltaic solar module. Merely by way of example, the present method and structure have been implemented to a solar module having single or multi junction photovoltaic materials, but it would be recognized that the invention may have other configurations.

From the beginning of time, human beings have been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, petrochemical energy is limited and essentially fixed based upon the amount available on the planet Earth. Additionally, as more human beings begin to drive and use petrochemicals, it is becoming a rather scarce resource, which will eventually run out over time.

More recently, clean sources of energy have been desired. An example of a clean source of energy is hydroelectric power. Hydroelectric power is derived from electric generators driven by the force of water that has been held back by large dams such as the Hoover Dam in Nevada. The electric power generated is used to power up a large portion of Los Angeles Calif. Other types of clean energy include solar energy. Specific details of solar energy can be found throughout the present background and more particularly below.

Solar energy generally converts electromagnetic radiation from our sun to other useful forms of energy. These other forms of energy include thermal energy and electrical power. For electrical power applications, solar cells are often used. Although solar energy is clean and has been successful to a point, there are still many limitations before it becomes widely used throughout the world. As an example, one type of solar cell uses crystalline materials, which form from semiconductor material ingots. These crystalline materials include photo-diode devices that convert electromagnetic radiation into electrical current. Crystalline materials are often costly and difficult to make on a wide scale. Additionally, devices made from such crystalline materials have low energy conversion efficiencies. Other types of solar cells use "thin film" technology to form a thin film of photosensitive material to be used to convert electromagnetic radiation into electrical current. Similar limitations exist with the use of thin film technology in making solar cells. That is, efficiencies are often poor. Additionally, film reliability is often poor and cannot be used for extensive periods of time in conventional environmental applications. There have been attempts to form heterojunction cells using a stacked configuration. Although somewhat successful, it is often difficult to match currents between upper and lower solar cells. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

The present invention relates generally to laser separation of thin film materials. More particularly, the present invention provides a method and system for laser separation to selectively removing a portion of a thin film device. In particular, the method is applied for edge fabrication of a thin film photovoltaic solar module. Merely by way of example, the present method and structure have been implemented to a solar module having single or multi junction photovoltaic materials, but it would be recognized that the invention may have other configurations.

In a specific embodiment, the present invention provides a method for laser separation of a thin film structure. The method includes providing an optically transparent substrate having a thickness, a back surface region, and a front surface region including an edge region. Additionally, the method includes forming a thin film structure including a conductive layer on the optical transparent substrate. The conductive layer immediately overlies the front surface region. Moreover, the method includes aligning a laser beam on a first portion of the edge region from the back surface region through the thickness of the optically transparent substrate. Furthermore, the method includes subjecting at least partially the conductive layer overlying the first portion to the laser beam to separate an edge portion of the thin film structure from the first portion of the edge region via absorbed energy from the laser beam.

In one embodiment, the method further includes converting the absorbed energy from the laser beam to latent heat of sublimation of the conductive layer at least partially, breaking apart the edge portion of the thin film structure above the first portion of the edge region, forming a cross-sectional region of remaining portion of the thin film structure, and cleaning the first portion of the edge region and the cross-sectional region substantially free of residues of the edge portion of the thin film structure.

In another specific embodiment, the present invention provides a method for processing a thin film device by laser separation. The method includes providing an optically transparent substrate having a thickness, a back surface region, and a front surface region including an edge region. The method further includes forming a thin film device on the optically transparent substrate. The thin film device includes a conductive layer overlying the front surface region and an edge portion overlying the edge region. Additionally, the method includes covering the back surface region except an exclusion area opposing to the edge region and aligning a laser beam from the back surface region through the thickness of the optically transparent substrate to irradiate on a first spot within the edge region. The method further includes subjecting the conductive layer within the first spot to absorbed energy from the laser beam to selectively removing a first portion of the thin film device directly over the first spot. Furthermore, the method includes scanning the laser beam from the first spot to a second spot within the exclusion area.

In another embodiment, the method further includes scanning the laser beam from the first spot to a second spot within the exclusion area to selectively remove the edge portion of the thin film device from the edge region and form a side wall of remaining portion of the thin film device. In one specific embodiment, the side wall of the thin film device comprises a plurality of layers substantially free of residue particles of the removed edge portion of the thin film device which otherwise cause layer-to-layer shorting. The method also includes applying encapsulating material overlying the thin film device coupled with one or more electric connectors.

Depending upon the specific embodiments, the invention provides many benefits or advantageous e features over conventional techniques. The present technique provides an easy to use process that relies upon conventional technology that is nanotechnology based. In some embodiments, the method may provide a solar module with higher efficiencies in converting sunlight into electrical power using a multiple junction design and method. Depending upon the embodiment, the efficiency can be about 10 percent or 20 percent or greater. Additionally, the method provides a process that is compatible with conventional process technology without substantial modifications to conventional equipment and processes. For example, the laser system and scanning operation can be easily controlled and automated. In a specific embodiment, the present method and system can also be provided using large scale and environmentally friendly manufacturing techniques, which eliminate the usage of solvent for cleaning the side surface and reduce running costs associated with the manufacture of the photovoltaic devices. In particular, the side surface the thin film photovoltaic devices exposed after laser separation process is completely cleaned without any shorting between layers of the thin film. In another specific embodiment, the present method and structure can also be provided using any combination of suitable single junction solar cell designs to form top and lower cells, although there can be more than two stacked cells depending upon the embodiment. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention relates generally to laser separation of thin film materials. More particularly, the present invention provides a method and system for laser separation to selectively removing a portion of a thin film device. In particular, the method is applied for edge fabrication of a thin film photovoltaic solar module. Merely by way of example, the present method and structure have been implemented to a solar module having single or multi junction photovoltaic materials, but it would be recognized that the invention may have other configurations.

Figure 1:
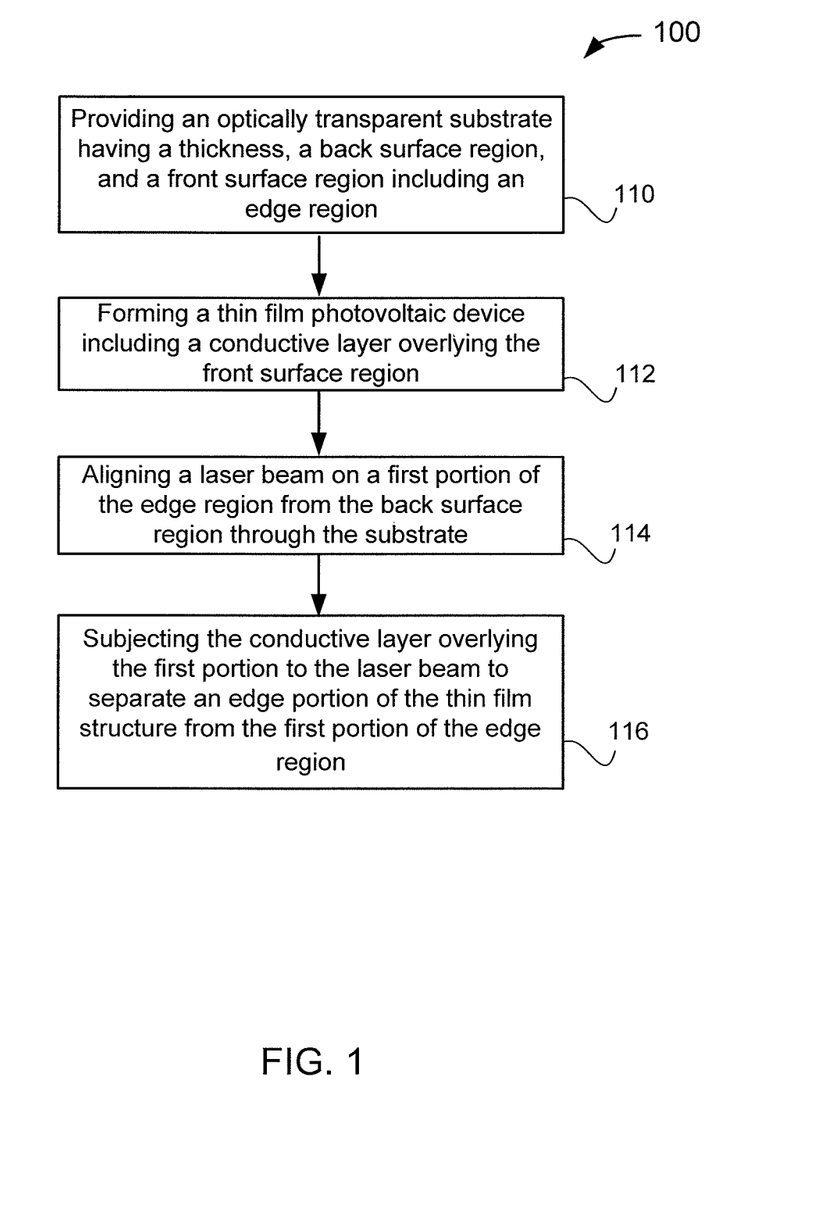
FIG. 1 is a simplified flowchart illustrating a method for fabricating a thin film device using laser separation according to an embodiment of the present invention.

FIG. 1 is a simplified flowchart illustrating a method for fabricating a thin film device using laser separation according to an embodiment of the present invention. This diagram is merely an example, which should not unduly limit the scope of the claims herein. The method 100 includes the following processes:

1. Process 110 for providing an optical transparent substrate having a back surface region and a front surface region including an edge region;

2. Process 112 for forming a thin film photovoltaic device including a conductive layer overlying the front surface region;

3. Process 114 for aligning a laser beam on a first portion of the edge region from the back surface region through the substrate; and 4. Process 116 for subjecting the conductive layer overlying the first portion to the laser beam to separate an edge portion of the thin film structure from the first portion of the edge region.

The above sequence of processes provides a method for fabricating a thin film device using a laser separation process for selectively remove an edge portion of thin film device formed on an optically transparent substrate according to an embodiment of the present invention. Other alternatives can also be provided where some processes are added, one or more processes can be removed, or one or more processes are provided in a different sequence without departing from the scope of the claims herein. Further details of the method can be found throughout the present specification and more particularly below.

Figure 2:
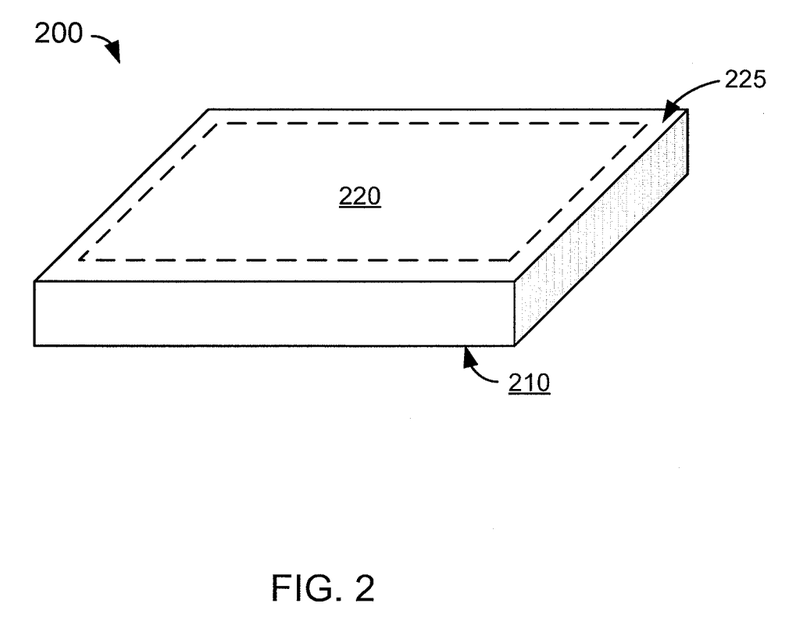
FIG. 2 is a simplified diagram illustrating a substrate provided for fabricating a solar module according to an embodiment of the present invention.

At Process 110, an optically transparent substrate is provided. This process can be visually illustrated by FIG. 2. FIG. 2 is a simplified diagram illustrating a substrate provided for fabricating a solar module according to an embodiment of the present invention. This diagram is merely an example, which should not unduly limit the scope of the claims herein. One of ordinary skill in the art would recognize many variations, alternatives, and modifications. As shown as a prospective view, the substrate 200 includes a thickness, a back surface region 210 (not directly viewable), and a front surface region 220 (directly viewable). The front surface region 220 has a edge region 225 schematically defined by a dashed loop line and the substrate periphery. In one embodiment, the substrate 200 is made of material that is optically transparent. For example, the substrate 200 can be a glass substrate, or a acrylic substrate, or a quartz substrate, or a fused silica substrate. In particular, the substrate material is at least transparent to lights with wavelengths ranging from about 400 nm to about 1200 nm. Of course, there can be other variations, alternatives, and modifications.

At Process 112, a thin film device is formed overlying the front surface region. In one embodiment, the thin film device includes a conductive layer which is formed immediately above the front surface region. Spanning across the substrate, the thin film device includes an edge portion of thin film materials overlying the edge region of the front surface region. In a specific embodiment, the thin film device can be a thin film photovoltaic device including at least a P-N junction formed by semiconductor layers sandwiched between the conductive layer and one or more electrode layers. In another embodiment, the thin film device includes multi-junction photovoltaic materials. For example, multiple single junction cells can be stacked structurally and/or electrically reconfigured by inter-coupling their electrode layers. In particular, more detailed description of the multi junction thin film photovoltaic devices can be found in a commonly assigned United Stated Patent Application No. 60/988,099 titled "THIN FILM METAL OXIDE BEARING SEMICONDUCTOR MATERIAL FOR MULTI-JUNCTION SOLAR CELL DEVICES" by Howard W. H. Lee filed at Nov. 14, 2007. Of course, there can be other variations, alternatives, and modifications.

Figure 3:
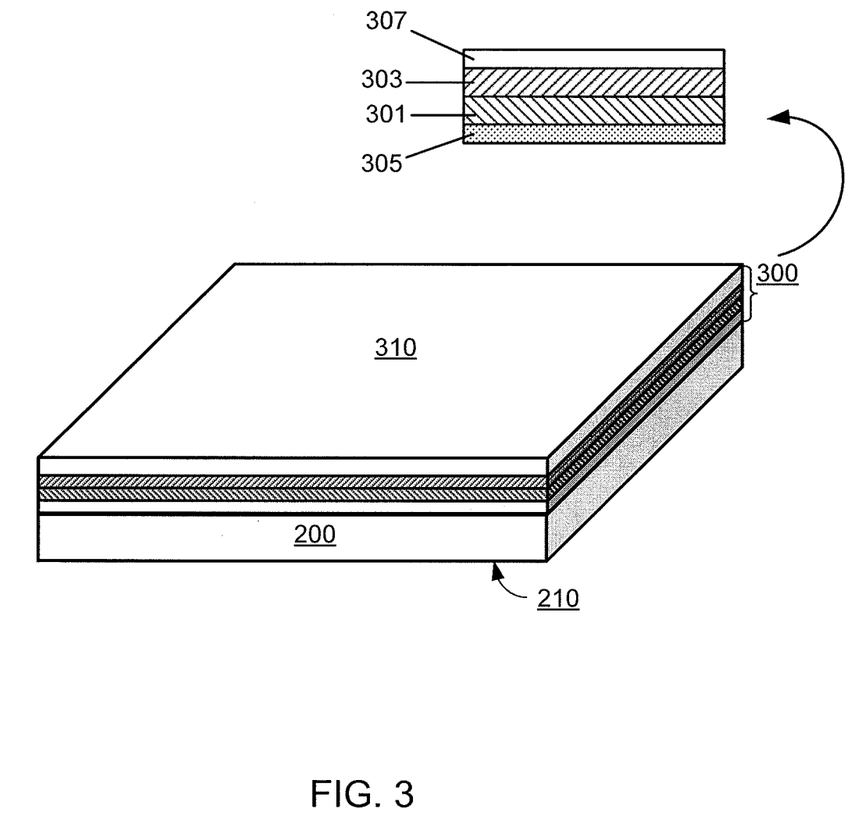
FIG. 3 is a simplified diagram illustrating a thin film device formed on the substrate according to an embodiment of the present invention.

As an illustration, FIG. 3 is a simplified diagram illustrating a thin film device formed on the substrate according to an embodiment of the present invention. This diagram is merely an example, which should not unduly limit the scope of the claims herein. One of ordinary skill in the art would recognize many variations, alternatives, and modifications. As shown, the thin film device 300 is formed overlying the front surface region 220 (now being covered) of the provided substrate 200. A enlarged side view of the thin film device schematically shows, as a simplified model, a plurality of layers overlying the front surface region 220. In one example as shown in FIG. 3, the plurality of layers includes a conductive layer 305 overlying front surface region 220, a layer 301 overlying the conductive layer 305, a layer 303 overlying layer 301, and another conductive layer 307 overlying layer 303. In one embodiment, the thin film device is a thin film photovoltaic device and the layer 301 can be a P-type semiconductor material made of silicon, or germanium, or III-V group semiconductor, or copper indium diselenide (CIS), or Copper Indium Gallium Selenide (CIGS), or Cadmium Telluride (CdTe), or metal oxide bearing semiconductor property, or nanostructured material. Correspondingly, the layer 303 can be a N-type semiconductor material made of silicon, or germanium, or III-V group semiconductor, or copper indium diselenide (CIS), or Copper Indium Gallium Selenide (CIGS), or Cadmium Telluride (CdTe), or metal oxide bearing semiconductor property, or nanostructured material. In another embodiment, the conductive layers 305 and 307 each serves as an electrode layer for the thin film photovoltaic device. The thin film device 300 has a surface region 310. Of course, these are exemplary illustrations which should not unduly limit the scope of the claims herein. One of skilled in the art should be able to recognize many variations, alternatives, and modifications of the thin film or thick film photovoltaic devices.

At Process 114, the method 100 includes aligning a laser beam on a first portion of the edge region from the back surface region through the optically transparent substrate. In an specific embodiment, the laser beam is introduced from the back surface region of the optically transparent substrate to facilitate removal of the thin film materials formed on the front surface region. In another specific embodiment, a laser source is provided at the vicinity of the back surface region to output the desired laser beam. The laser beam is aligned in a direction substantially vertical to the back surface region of the optical transparent substrate. The laser beam irradiates at a spot within a region near an edge of the back surface region and is configured to be scanned along the periphery of the back surface region. The laser beam penetrates the thickness of the optically transparent substrate to reach at the first portion of the edge region of the front surface region.

Figure 4:
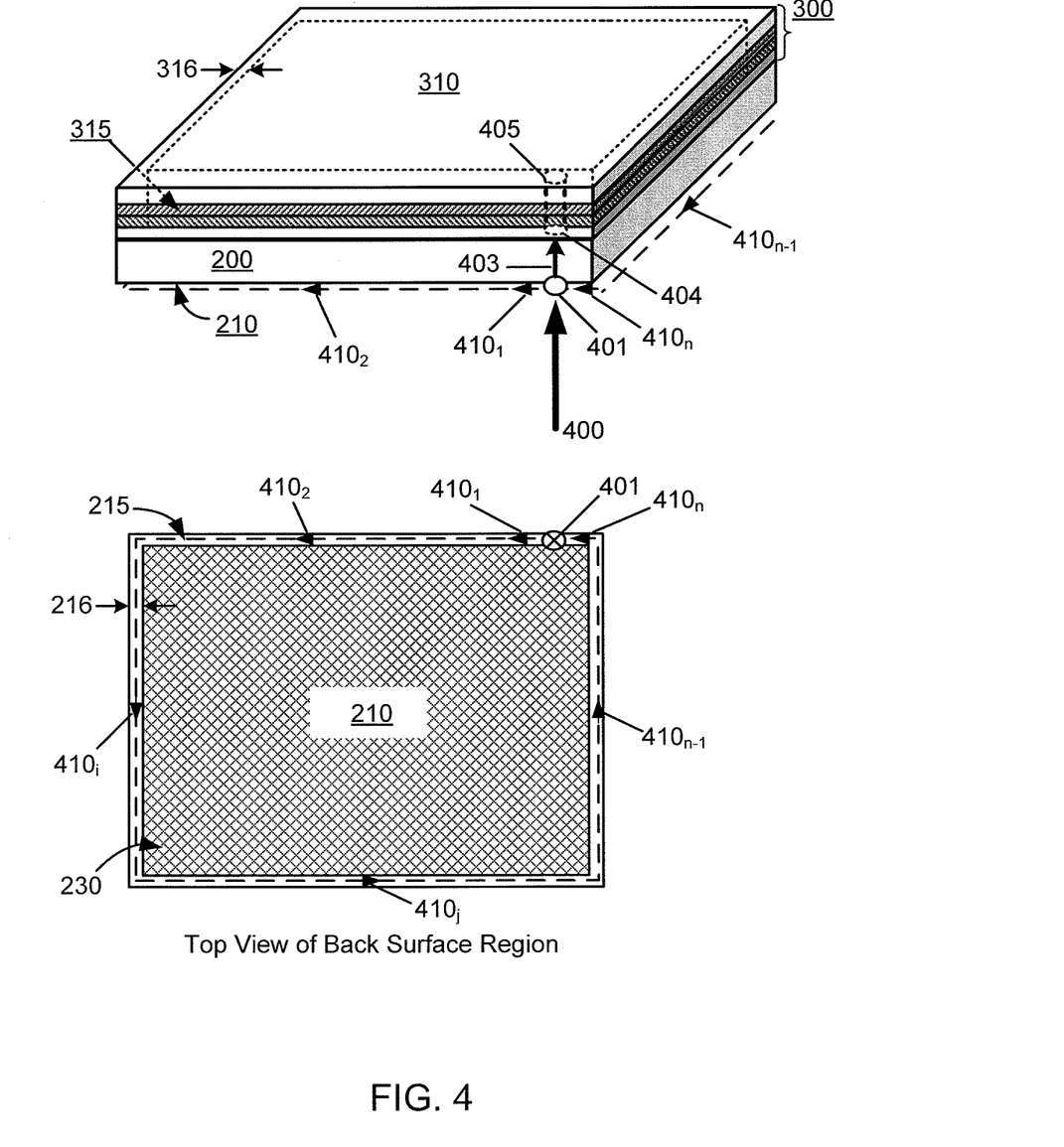
FIG. 4 is a simplified diagram illustrating a laser separation process for fabricating a thin film device according to an embodiment of the present invention.

FIG. 4 is a simplified diagram illustrating a snap shot of a laser beam being aligned to irradiate at an edge spot of back surface region during a laser separation process according to an embodiment of the present invention. This diagram is merely an example, which should not unduly limit the scope of the claims herein. One of ordinary skill in the art would recognize many variations, alternatives, and modifications. As shown, laser beam 400 is aligned to irradiate at an edge spot 401 on the back surface region 210 of the optically transparent substrate 200 in a direction substantially perpendicular to the back surface region. In one embodiment, the laser beam can be generated from a high power laser source characterized by a Q-switched mode-locking mechanism to output a laser beam with a wavelength in a range of about 500 nm to about 1200 nm. In particular, a solid state laser source based on $Nd^{3+}$ ingredient is used. The laser source is a pulsed laser source with a pulse length varying from nanoseconds to milliseconds and a tunable pulse duration from microseconds to milliseconds. For example, a Nd:YAG pulsed laser source is used. In another example, a pulsed fiber laser is used. In another embodiment, the laser flux used is operably controlled to have a homogenous top-hat beam intensity profile to provide desired uniform intensity within a beam spot size of about 3 mm or bigger (if beam expander can be used). For example, the energy density of as high as 50 W/$cm^2$ within the spot size can be provided. The aligned laser beam 403 penetrates through the substrate 200 and reaches a portion 404 of the edge region to irradiate the thin film material formed immediately above the portion on the front surface region. Of course, there can be other variations, alternatives, and modifications. The laser source may not be limited to specific type provided that proper power density, beam profile, pulse characteristics, and scanning mechanism are available depending on the type of material to be separated.

Referring to FIG. 4 again, a top view of back surface region 210 is also schematically given. As shown, a stop band layer 230 is added to cover the back surface region 210 except an exclusion area 215 along a periphery of the back surface region. The stop band layer 230 can be a sheet material that is opaque to the laser beam 400 which can only pass through the substrate within the exclusion area. The stop band layer does not have to be in contact with the back surface region. In one embodiment, the edge exclusion area 215 can be one or more edge sections associated with a shape of the substrate 200. In another embodiment, the exclusion area comprises a width 216 through a whole length of the periphery of the back surface region 210. For example, the width 216 can be 0.5 cm to 1 cm and more depending on applications. The laser beam 400 now is seen as the spot 401 located at a position within the exclusion area 215. In one embodiment, the laser spot size can be smaller than the width 216 of the exclusion area 215 so that the whole laser beam 400 can pass through the substrate. In another embodiment, the laser spot size can be bigger than the width 216 so that the laser beam 400 is partially blocked and partially passed.

At Process 116 the method 100 includes subjecting the conductive layer overlying the first portion to the laser beam to separate an edge portion of the thin film structure from the first portion of the edge region. First of all, as shown in FIG. 4, the laser beam 400 is irradiated at spot 401 substantially vertically from the back surface region. Then the beam 403 then reaches a first portion 404 of the edge region (e.g., region 225 in the front surface region 220 seen in FIG. 2) that is opposed to the edge spot 401. A conductive layer, for example, the layer 305 as seen in FIG. 3, of the thin film device 300 is a first layer formed immediate above front surface region 220. Thus, a portion of the conductive layer directly above first portion 404 of the edge region is subjected to the laser beam irradiation. In one embodiment, the conductive layer is characterized by a strong absorbance band corresponding to the laser wavelengths ranging from 500 nm to 1200 nm. Therefore, the conductive layer within the first portion 404 is subjected to absorbing light energy from the laser beam 403.

At least partially, the absorbed energy is transformed into latent heat of sublimation of a portion of conductive layer. Within a time of laser pulse length from 10 ns and more, the heat induced by the high power density pulsed laser (as high as about 50 W/cm$^2$) can be sufficient high to make a portion of conductive layer sublimated. The sublimated portion of conductive layer then rapid expands its volume and generate a highly directional mechanical force in parallel to the aligned laser beam to break apart film material directly above the portion of the conductive layer. Therefore, the whole thickness of the thin film materials within the irradiated beam spot is selectively removed or blown away from the first portion 404 of the edge region in such a laser separation process. Because laser pulse lengths are very short and the beam profile is tuned to a top-hat shape, materials beyond the beam spot absorbs very little heat. The laser separation process to selectively remove a portion of thin film materials can be controlled to form an cross-sectional region with high edge precision. For example, as shown in FIG. 4, a column of thin film device materials 405 is removed from the first portion 404 of the edge region. In addition, depending on the optical property of the thin film materials used for the thin film photovoltaic device, the laser wavelength, power flux and beam spot size can be adjusted accordingly for a desired laser separation result. The embodiments of the present invention may not limit a specific type of laser source to generate the laser with the above characteristics, provided that proper power density, beam profile, pulse characteristics, and scanning mechanism are available depending on the type of material to be separated.

Additionally in an embodiment, the laser beam is configured to be scanned from a first portion to a second portion along the edge region. For example, the laser beam 400 is generated by a laser source (not shown) comprising one or more mirrors/lens which are configured to scan the beam from a first spot to a second spot within the exclusion area 215 along a peripheral path. In another example, the laser source and the laser beam 400 itself may be fixed in position while a stage that supports the substrate 200 can be operated by a robot to move laterally so that the laser beam 400 relatively scan within the exclusion area from the first spot to a second spot. As shown in FIG. 4, the dashed line represents the laser beam scanning path and a plurality of arrows $410_1$, $410_2$, $410_i$, $410_j$, $410_{n-1}$, and $410_n$ each represents a particular spot location of the laser beam along a path within the exclusion area 215. For example, the laser beam 400 is scanned from a first spot location $410_1$ to a second spot location $410_2$, and further to spot $410_i$, and so on.

Subsequently, the scanning process involves a step by step moving of the beam spot. In one embodiment, the rate of scanning can be adjusted to accommodate with the laser power pulse length and duration. In one example, at each step the beam spot is irradiated within a time period of one laser pulse length before moving to an immediate next step within a time period of a pulse duration. At each step the beam spot size is configured to be spatially overlapped by about 10-30% with the beam spot at the immediate last step. In one process, the laser beam 400 may be scanned a whole loop of the exclusion area 215 along the periphery of the back surface region from the first spot location $410_1$, through $410_2$ to $410_n$ and finally returned the starting location $410_1$. In such a process, the whole peripheral edge portion 315 of the thin film device 300 is selectively removed. Of course, there can be many variations, alternatives, and modifications.

Along with the scanning path at each step the laser beam 400 passes through the substrate 200 from the back surface region to become the beam 403 which correspondingly irradiate a portion (such as the first portion 404) of the edge portion on the front surface region. Thus, as the laser beam scanning is in progress the portion of thin film materials under the beam 403 at the step are subsequently removed by the laser separation process shown above. FIG. 4 also schematically illustrates that the edge portion 315 of the thin film photovoltaic device 300 having a width 316 from the edge of substrate and a length up to the whole periphery of the substrate is opposed to the exclusion area 215 with a width 216 on the back surface region 210. Following certain scanning routines, the edge portion 315 of the thin film materials can be selectively removed from the edge region. In other words, a width 316 of front surface region along its periphery can be exposed. In one embodiment, the width 316 is equal to or smaller than the width 216. In one example, the removed edge portion 315 is a whole peripheral edge portion of a thin film photovoltaic device.

Figure 5:
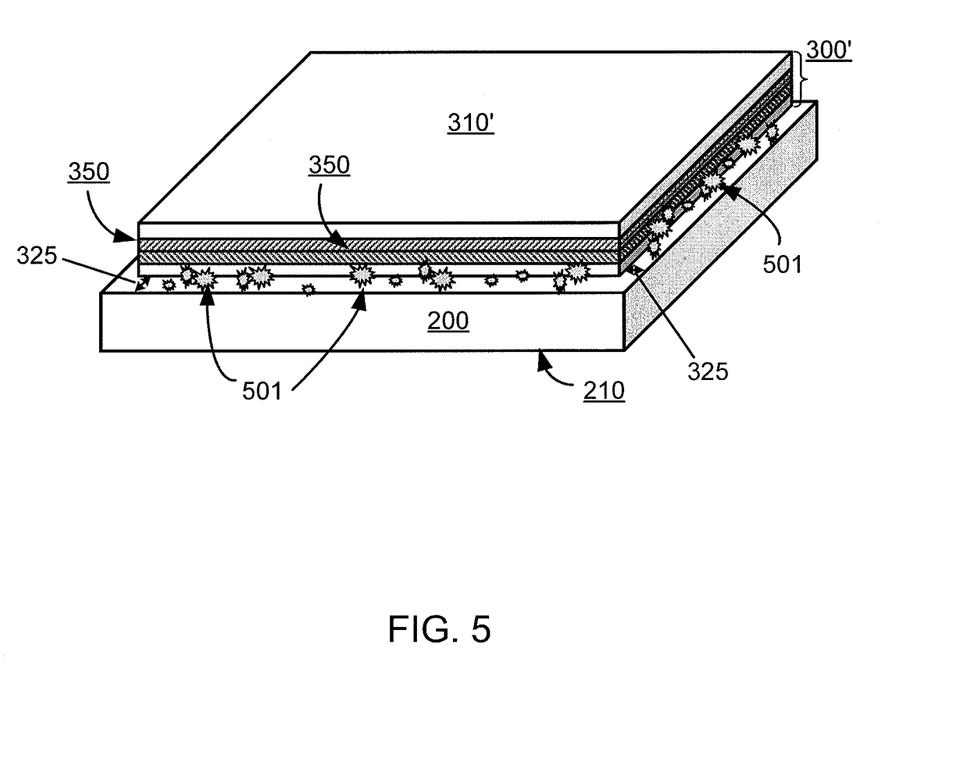
FIG. 5 is a simplified diagram illustrating an edge portion of the thin film device with some residues of thin film materials on the edge region in an intermediate state of a laser separation process according to an embodiment of the present invention.

Additionally, some processes mentioned above may be performed in different order, or other processes may be added to the method 100. For example, removing an edge portion of thin film device may be accompanied by a process of cleaning the edge region substantially free of residue of removed edge portion. As mentioned above, the laser separation process involves several mechanisms including at least converting laser energy to latent heat of sublimation for a portion of the conductive layer overlying the surface region within the beam spot and breaking apart a column of film materials above the spot by direction mechanical force induced through a rapid volume expansion of the sublimated portion of the conductive layer. During the process, majority amount of small film material pieces, particles, and dusts resulting from the broken apart portion of the thin film device are blown away. While possibility for certain amount of residues to be around the process region still exists. FIG. 5 is a simplified diagram illustrating an edge portion of the thin film device with some residues of thin film materials on the edge region in an intermediate state of a laser separation process according to an embodiment of the present invention. This diagram is merely an example, which should not unduly limit the scope of the claims herein. One of ordinary skill in the art would recognize many variations, alternatives, and modifications. As shown, in an intermediate state of a laser separation process, some residue thin film materials 501 may be left on the edge region 225 after the edge portion 315 of the thin film device 300 is removed with a newly formed side walls 350 and a remaining portion of surface region 310'. These residue materials 501 need to be removed immediately to prevent them from redepositing onto the surface region 310' or side walls 350 of the thin film device 300'. In one embodiment, a vacuum head can be introduced over the front surface region near the edge region in association with the scanned laser beam. The vacuum head can suck out any residues in various forms of small pieces, particles, dusts, or vapors from the laser separation process to clean the edge region and the side walls of the remaining portion of the thin film device substantially free of residues. Other cleaning methods may be used. In one example, mechanically scrapping is used. In another example, laser ablation is applied. In yet another example, chemical or physical etching may be used. Of course, there can be other variations, alternatives, and modifications.

Figure 6:
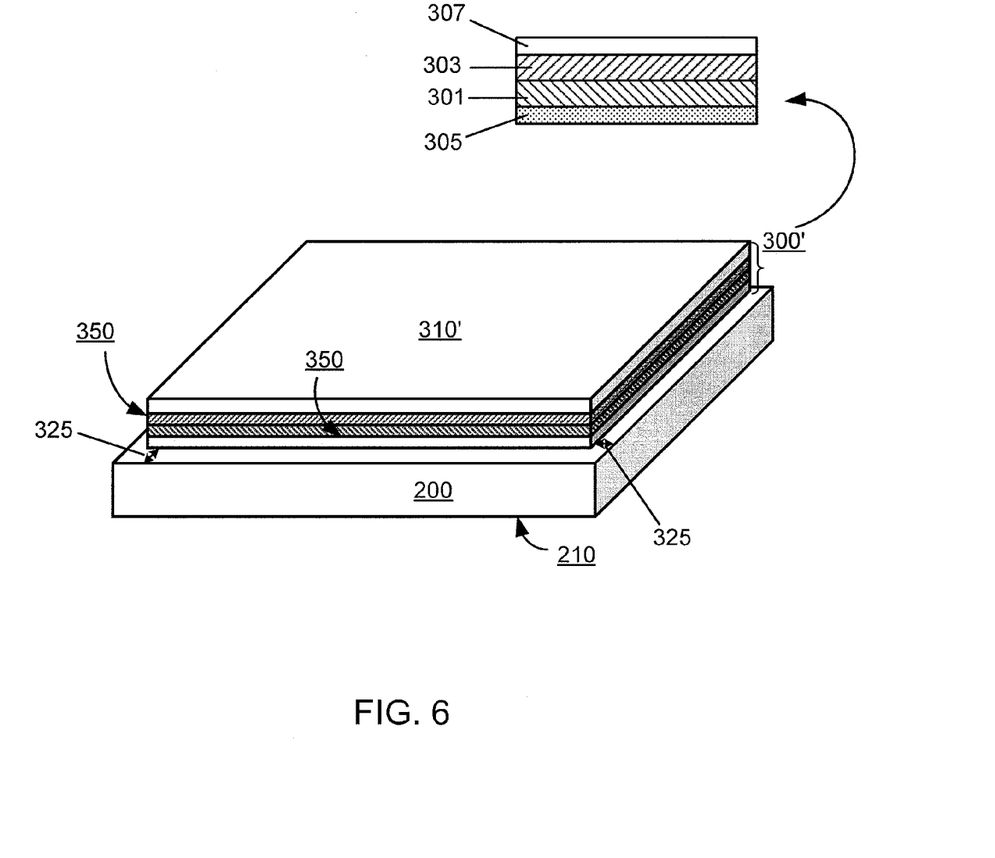
FIG. 6 is a simplified diagram illustrating a thin film device with edge portion being selectively removed in a final state of the laser separation process according to an embodiment of the present invention.

FIG. 6 is a simplified diagram illustrating a thin film device with edge portion being selectively removed in a final state of the laser separation process according to an embodiment of the present invention. This diagram is merely an example, which should not unduly limit the scope of the claims herein. One of ordinary skill in the art would recognize many variations, alternatives, and modifications. As shown, in a final state of the laser separation process, the exposed edge region 325 as well as the newly formed side walls 350 are substantially free of residue materials 501. In one embodiment, the exposed edge region 325 is substantially equal to the width 316 of the laser ablated edge portion 315. In another embodiment, the exposed edge region is equal to or smaller than the edge region 225 (defined in FIG. 2). In yet another embodiment, the side walls 350 with exposed multiple layers overlying the remaining portion of the front surface region includes all the plurality of layers presented in the original thin film device as well as substantially free of particles for causing electrical shorting between the layers. Of course, there can be other variations, alternatives, and modifications.

Figure 8:
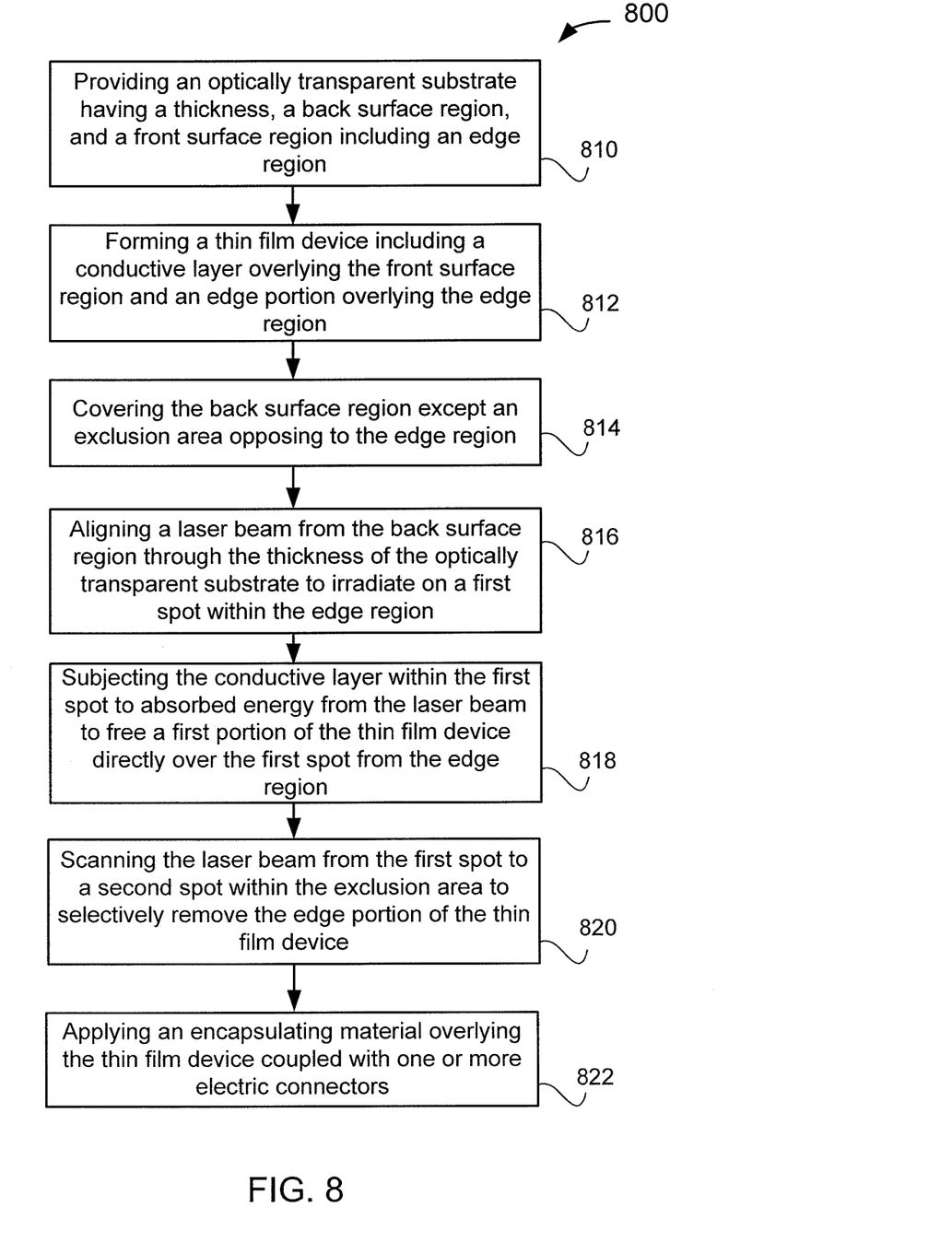
FIG. 8 is a simplified flowchart showing a method of processing a thin film device by laser separation according to an embodiment of the present invention.

FIG. 8 is a simplified flowchart showing a method of processing a thin film device by laser separation according to an embodiment of the present invention. This diagram is merely an example, which should not unduly limit the scope of the claims herein. The method 800 includes providing an optically transparent substrate having a thickness, a back surface region, and a front surface region including an edge region (810). A thin film device including a conductive layer overlying the front surface region and an edge portion overlying the edge region is provided (812). The edge region is a width of spatial region along a periphery of the front surface region. The method 800 then includes (814) covering the back surface region except an exclusion area opposing to the edge region and (816) aligning a laser beam from the back surface region through the thickness of the optically transparent substrate to irradiate on a first spot within the edge region.

A portion of conductive layer that is directly overlying the first spot within the edge region is subjected to absorbed energy from the laser beam to free a first portion of the thin film device directly over the first spot from the edge region (818). The method 800 further includes (820) scanning the laser beam from the first spot to a second spot within the exclusion area to selectively remove the edge portion of the thin film device. During the process, a side walls of the remaining portion of the thin film device also is formed. In one embodiment, the method 800 additionally includes a step of applying an encapsulating material overlying the thin film device coupled with one or more electric connectors (822).

It should be appreciated that the specific steps illustrated in FIG. 8 provide a particular method of fabricating a thin film device including photovoltaic solar module according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

For example, the optically transparent substrate provided in step 810 is the substrate 200 including a back surface 210 and a front surface 220 with an region 225 as described in FIG. 2. The substrate 200 can be made of material that is optically transparent at least to lights with wavelengths ranging from about 400 nm to about 1200 nm. For example, the substrate 200 can be a glass substrate, or a acrylic substrate, or a quartz substrate, or a fused silica substrate.

Step 812 for forming a thin film device including a conductive layer overlying the front surface region and an edge portion overlying the edge region may be achieved by depositing or painting, or coating a plurality of layers of thin film materials on the front surface 220 of the substrate 200. In one example, the plurality of layers includes one or more electrode layers and one or more photovoltaic material layers forming one or more P-N junction structures. For example, a P-N junction structure includes a N-type semiconductor layer 303 overlying a P-type semiconductor layer 301 as shown in FIG. 3. In another example, the one or more electrode layers at least includes a conductor layer 305 directly overlying the front surface region and is also coupled with the layer 301. Another conductive layer 307 overlies and couples to the N-type semiconductor layer 303. Of course, there can be other alternatives, variations, and modifications.

In another embodiment, the substrate with the thin film device formed on the front surface has its back surface covered by a stop band layer. At the step 814, the stop band layer is applied to cover most portion of the back surface of the substrate while exposing an exclusion area. For example, the edge exclusion area 215 with a width 216 is exposed by a stop band layer 230. The stop band layer 230 can be a solid sheet material that is optically opaque to the lights being transparent to the substrate 200. In one example, the stop band layer is a shutter in between the back surface and a laser source applied by a robot. The width of the exclusion region is predetermined based on packaging requirement of the thin film device for module fabrication. For example, the edge exclusion area 215 with the width 216 correspondingly opposes to an edge portion 315 (with a width 316) of the thin film device 300 overlying the front surface region 220.

At step 816, a laser source is disposed near the back surface region to output a laser beam towards the back surface region. The laser beam is aligned and tuned with a proper beam intensity profile to irradiate at a spot within the exclusion area. For example, a pulsed laser beam 400 with a top-hat intensity profile is spotted at a first spot 401 of the exclusion area 215 in a direction substantially perpendicular to the back surface region 210, as shown in FIG. 4. The edge location irradiated direct by the laser beam 400 is opposed to a bottom spot of edge portion 315 of a thin film photovoltaic device residing on the edge region 225 of the front surface region 220. The laser beam is able to pass through the transparent substrate from the back surface region within the exclusion area confined by the stop band layer to reach at a first portion of the edge region on the front surface region.

At step 818, a portion of conductive layer above the first portion of the edge region is then subjected to absorbed energy from the laser beam. In one embodiment, the laser wavelength is predetermined based on the optical property of the conductive layer so that most laser energy is absorbed to turn into heat. Due to the high energy density of the laser with a top-hat beam profile, at least a portion heat is converted to latent heat of sublimation of the conductive layer under the beam spot. Vaporization of those sublimated portion of the conductive layer induces all the first portion of thin film devices directly above those sublimated conductive layer substantially free from the first spot of the edge region.

Furthermore, at step 820 and forward the laser beam is scanned along a path within the exclusion area from a first spot to a second spot. In one embodiment, scanning the laser beam is performed by moving the beam spot step by step. At each step the laser beam is power on within a time period of a pulse length to irradiate the material within the beam spot. Subsequently, the beam spot is shifted to a next step within another time period of a pulse duration. The beam spot at the next step is spatially overlapped by about 10-30% with the beam spot at the previous step. In one example, the laser pulse length is in an range of 1 to 1000 microseconds. In another example, the pulse duration is in an order of microseconds or greater. Depending on the beam spot size and the desired width of material to be removed, the laser beam is scanned to cover all areas of the exclusion region. For example, the laser beam is scanned from a spot $410_1$ to another spot $410_n$ through the whole periphery of the back surface region as shown in FIG. 4. In one embodiment, the laser beam can be scanned by operating an optical system using one or more mirrors/lens to redirect the laser beam. In another embodiment, the laser beam can be scanned across the path by relatively moving the substrate accordingly (while the laser beam itself being fixed) by a robot. Whenever the pulsed laser beam reaches a new portion of the edge portion, a corresponding portion of thin film materials irradiated by the beam spot can be freed by the laser separation process. Finally the edge portion with a desired width of the thin film device and a length up to the whole periphery of the substrate can be selectively removed from the corresponding portion of the edge region. At the same time, a side wall or a cross-sectional region of the remaining portion of the thin film device is formed along its periphery.

Further, referring to FIG. 5 and FIG. 6, the method 100 may include certain cleaning process that is performed substantially at the same time as the laser separation process so that the exposed edge region and newly formed side wall of the remaining portion of the thin film device are substantially free from any residues of the removed film materials. For example, the cleaning process includes using a vacuum head associated with the scanned laser beam to suck out the dusted materials out of the laser separation and scanning processes. In another example, the cleaning process can be performed by mechanically scrapping, or laser ablation, or etching process after the laser separation and scanning processes.

Additionally, the side wall formed is the cross-section surface essentially made of the plurality of layers of functional materials for the thin film device, including at least a P-N junction and one or more electrode layers. For example, as shown in FIG. 6, a cross-sectional region 350 is formed or revealed at the edge portion of a processed thin film photovoltaic device 300'. The side wall or cross-sectional region 350 reveals a layer 307 overlying a layer 303 on top of a layer 301 overlying another layer 305. In one example, the layers 305 and 307 are respective conductor electrode layer for corresponding photovoltaic cell. Similar to the edge region, the newly formed cross-section surface is also substantially free of residue materials that may cause electric shorting between the layers (for example, between layer 301 and layer 303) if any exists. Of course, there can be many alternatives, variations, and modifications.

Furthermore, the method 800 includes a step of applying an encapsulating material overlying the plurality of thin film device coupled to one or more electric connectors (Step 822). After the laser separation and scanning process (steps 818 and 820) and subsequent/inherent cleaning process, a thin film device has its edge region fabricated to be capable for coupling with other thin film devices. For example, around the edge region with an edge portion of thin film materials removed, one or more electric connectors can be coupled to corresponding electrode layers within the revealed cross-sectional region. Then, the rest portion of the thin film device can be applied an encapsulating material overlying the remaining surface region including at least partial cross-sectional region coupled to one or more electric connectors.

Figure 7:
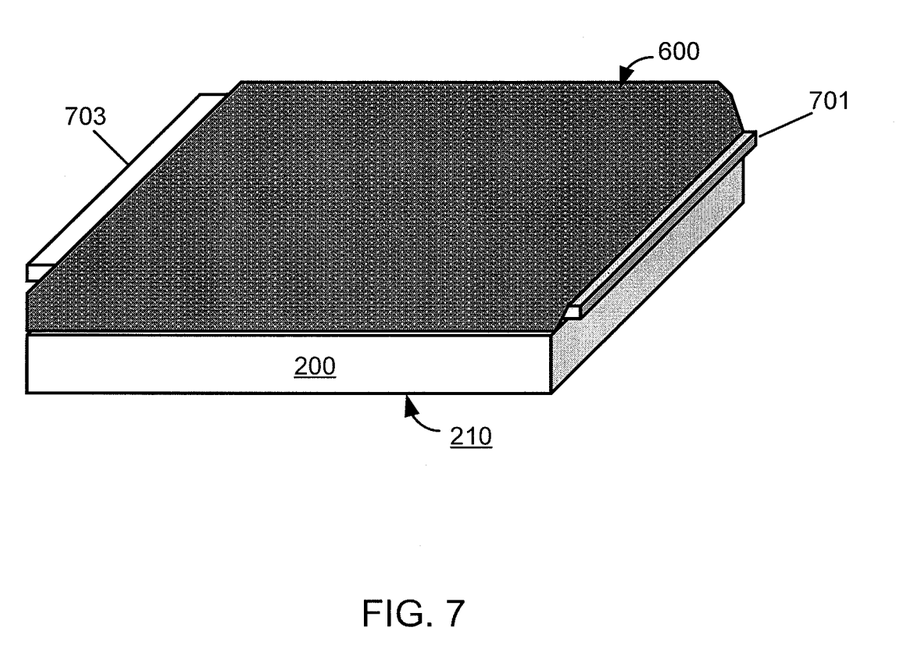
FIG. 7 is a simplified diagram illustrating a thin film device coupled with electric connectors and covered by an encapsulating material according to an embodiment of the present invention.

FIG. 7 is a simplified diagram illustrating a thin film device coupled with electric connectors and covered by an encapsulating material according to an embodiment of the present invention. This diagram is merely an example, which should not unduly limit the scope of the claims herein. One of ordinary skill in the art would recognize many variations, alternatives, and modifications. As shown, electric connector 701 and 703 are respectively coupled to corresponding electrode layer at one side of the cross-sectional region of the thin film device. On top of the thin film device, including at least partially the cross-sectional region, an encapsulating material 600 is applied. For a thin film photovoltaic device, encapsulating materials serve as a protection layer for the assembled solar module and also serve as a bounding material for coupling packaging material such as frames and glass panels to the photovoltaic cells therein. For example, the encapsulating materials can be selected from EVA, PVA, acrylic, reflowable glass, and sol gel. Of course, there can be many alternatives, variations, and modifications.

Figure 9:
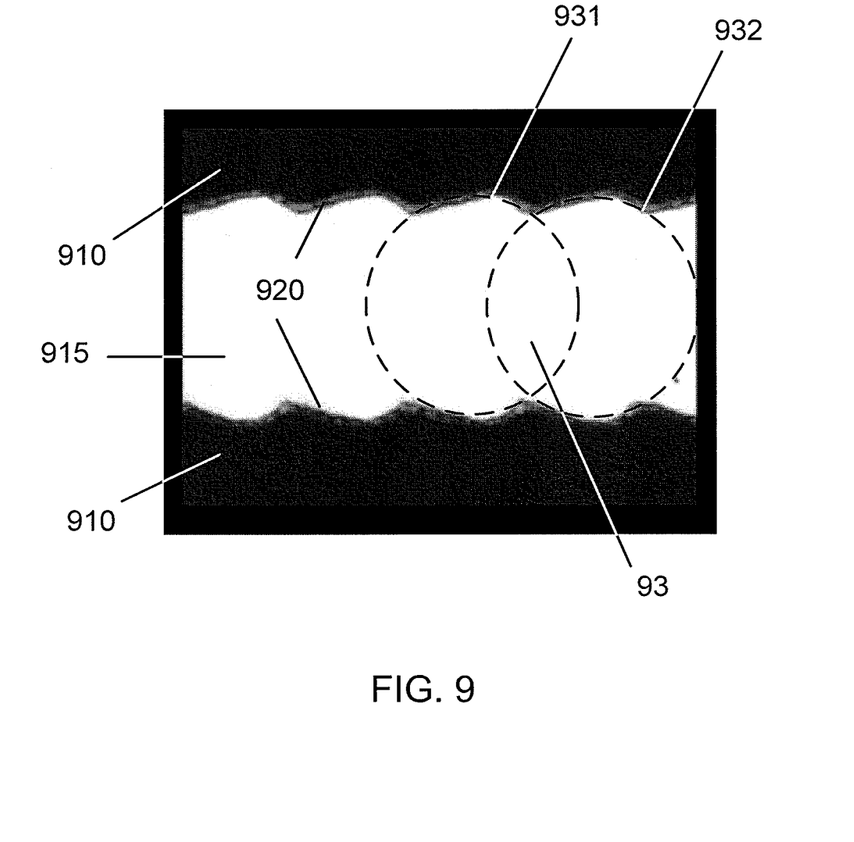
FIG. 9 is an exemplary optical microscope image of a channel formed in the thin film device by laser separation according to an embodiment of the present invention.

FIG. 9 is an exemplary optical microscope image of a channel formed in the thin film device by laser separation according to an embodiment of the present invention. This diagram is merely an example, which should not unduly limit the scope of the claims herein. One of ordinary skill in the art would recognize many variations, alternatives, and modifications. As shown, a channel 910 (bright color region) is formed by the laser separation process as a laser beam scans in one direction step by step across the thin film device 920 (dark color region) from the back surface region of the transparent substrate. Within the channel 910, the thin film material has been substantially removed from the transparent substrate, making it fully bright as illuminated by the microscope light. Beyond two edges 925, the thin film materials 920 remain intact (and opaque to the microscope illumination light) without any sign of crack and residual particle decoration, as evidenced by the sharp contrast of the edges. The two dashed circles 931 and 932 is schematically indicate the two subsequent beam spots during the scanning. For example, the beam scanning speed is about 4 meters per second. At each spot, the power up to 20 W laser irradiation is on with a pulse frequency of about 125 kHz. As shown, an overlapping region 93 has an estimate 20% population of each beam size (the beam diameter is about 3 mm). Of course, there can be many alternatives, variations, and modifications. For example, such scanning laser beam spots can be placed within the edge regions of any sized thin-film devices including photovoltaic cells. One or more circumferential laser scannings with such laser beam can create desired width for the edge exclusion region for manufacture of larger solar panel systems by coupling a plurality of multi junctions thin film photovoltaic cells.

It is also understood that the examples and embodiments described herein are for illustrative purposes only and that various modifications or changes in light thereof will be suggested to persons skilled in the art. For example, embodiments according to the present invention have been described for fabricating a solar module using a laser separation process to trim an edge portion of associated thin film photovoltaic devices. The description of the thin film photovoltaic device structure associated with the solar module can be further found in a co-assigned United Stated Patent Application No. 60/988,099 titled "THIN FILM METAL OXIDE BEARING SEMICONDUCTOR MATERIAL FOR MULTI-JUNCTION SOLAR CELL DEVICES" by Howard W. H. Lee filed at Nov. 14, 2007. But, ordinary skilled in the art should recognize that many variations of the thin film photovoltaic device structures can be still applied by the present invention. Additionally, embodiments of the invention can be applied to a much broader field other than the fabrication of solar module. Various modifications and changes can be included within the spirit and purview of this application and scope of the appended claims.

What is claimed is:

1. A method for processing a thin film device by laser separation, the method comprising:
    providing an optically transparent substrate having a thickness, a back surface region, a front surface region, and an edge region;
    forming a thin film device on the optically transparent substrate, the thin film device including a conductive layer overlying the front surface region and an edge portion overlying the edge region;
    covering the back surface region except an exposed area along the edge region;
    aligning a laser beam from the back surface region through the thickness of the optically transparent substrate to irradiate a first spot within the edge region;
    energy from the laser beam thereby selectively removing part of the edge portion to form a remaining side wall portion to expose at least the conductive layer, a P-type semiconductor layer overlying the conductive layer, a N-type semiconductor layer overlying the P-type semiconductor layer, and an electrode layer overlying the N-type semiconductor layer, exposed edges of the plurality of layers being substantially free from residue particles; and
    scanning the laser beam along the exposed area.

2. The method of claim 1 wherein the optically transparent substrate comprises one of glass, acrylic, quartz, or fused silica which is transparent at least to light with wavelengths from 400 nm to 1200 nm.

3. The method of claim 1 wherein the exposed area has a width of about 1 centimeter from a nearest edge of the back surface region and a length up to a periphery of the back surface region.

4. The method of claim 1 wherein the step of covering the back surface region comprises disposing a sheet material on the back surface that is opaque to light with wavelengths ranging from 400 nm to 1200 nm.

5. The method of claim 1 wherein aligning a laser beam from the back surface region comprises placing a laser source near the back surface region and directing the laser beam in a direction substantially perpendicular to the back surface.

6. The method of claim 5 wherein the laser beam is provided by a Q switched mode-locked Nd:YAG laser source characterized by an output wavelength range from 500 nm to 1200 nm, a homogeneous top-hat beam intensity profile with a spot size about 3 mm and more, an energy density of about 50 W/cm2, a pulse length ranging from nanoseconds to milliseconds, and a tunable pulse duration ranging from 10 microseconds to 1 millisecond.

7. The method of claim 1 wherein the step of aligning a laser beam from the back surface region through the thickness of the optically transparent substrate to irradiate a first spot within the edge region comprises:
    subjecting the conductive layer within the first spot to absorbed energy from the laser beam:
    at least partially converting the absorbed energy from the laser beam to latent heat of sublimation of the conductive layer; and
    breaking apart the first portion of the thin film structure above the first spot of the edge region.

8. The method of claim 1 wherein scanning the laser beam along the exposed area comprises redirecting the laser beam with an optical system or moving a stage supporting the optically transparent substrate with a robot relative to the laser beam.

9. The method of claim 8 wherein scanning the laser beam comprises moving a beam spot step by step, wherein the laser beam irradiates materials within the beam spot for a time period of a laser pulse length at each step before moving to an immediate next step within a time period of a laser pulse duration, the beam spot at each step spatially overlaps about 10-30% with the beam spot at the immediate next step.

10. The method of claim 9 further comprising cleaning the edge region and the side wall of remaining portion of the thin film device with a vacuum head.

11. The method of claim 1 further comprising processing the conductive layer and the electrode layer to connect them with electric connectors producing electrical coupling to which other thin film devices may be connected, and then applying an encapsulating material over the thin film device.

12. A method for processing a thin film device having a conductive layer and an edge region on an optically transparent substrate comprising:
    covering a back surface of the optically transparent substrate except an exposed area along the edge region;
    aligning a laser beam from the back surface of the optically transparent substrate to irradiate a spot within the edge region;
    energy from the laser beam thereby selectively removing part of the edge region to form a remaining side wall portion exposing at least the conductive layer, a P-type semiconductor layer overlying the conductive layer, a N-type semiconductor layer directly overlying the P-type semiconductor layer, and an electrode layer overlying the N-type semiconductor layer, exposed edges of the plurality of layers being substantially free from residue particles; and
    scanning the laser beam along the edge region.

13. The method of claim 12 wherein the optically transparent substrate comprises one of glass, acrylic, quartz, or fused silica being transparent at least to the laser beam.

14. The method of claim 12 wherein the step of aligning a laser beam comprises placing a laser source to output the laser beam substantially perpendicularly to the back surface region.

15. The method of claim 14 wherein the laser source comprises a Q switched mode-locked Nd:YAG laser source characterized by an output wavelength range from 500 nm to 1200 nm, a homogeneous top-hat beam intensity profile, and energy density of about 50 W/cm2.

16. The method of claim 14 wherein the laser source is a pulsed laser source with a pulse length ranging from nanoseconds to milliseconds and a pulse duration ranging from 10 microseconds to 1 milliseconds.

17. The method of claim 12 wherein the edge region comprises a width of about 1 centimeter from a nearest periphery edge of the optically transparent substrate.

18. The method of claim 12 wherein the conductive layer comprises one of a metal, a metal alloy, and a metal oxide.

19. The method of claim 12 wherein the thin film device comprises photovoltaic materials overlying the conductive layer.

20. The method of claim 19 wherein the photovoltaic materials comprise at least one of single crystal silicon, polycrystal silicon, amorphous silicon, semiconducting metallic oxides, compound semiconductor including copper indium diselenide (CIS), Copper Indium Gallium Selenide (CIGS) Cadium Telluride (CdTe), and nano-structured materials.

21. The method of claim 12 further comprising
cleaning the thin film device to remove residues.

22. The method of claim 12 further comprises scanning the laser beam along the edge region, wherein a beam spot at each step at least spatially overlaps a beam spot at an immediate last step by about 10-30%.

23. The method of claim 22 wherein the scanning comprises redirecting the laser beam with an optical system.

* * * * *